United States Patent [19]
Miyashita

[11] Patent Number: 5,727,030
[45] Date of Patent: Mar. 10, 1998

[54] AUTOMATIC FREQUENCY CONTROL CIRCUIT APPLICABLE TO A MOBILE COMMUNICATION SYSTEM

[75] Inventor: Toshikazu Miyashita, Tokyo, Japan

[73] Assignee: NEC Corporation, Japan

[21] Appl. No.: 630,951

[22] Filed: Apr. 5, 1996

[30] Foreign Application Priority Data

Apr. 11, 1995 [JP] Japan ................................. 7-110040

[51] Int. Cl.⁶ ............................................ H04L 27/06
[52] U.S. Cl. ...................... 375/344; 375/336; 455/182.2; 331/1 A
[58] Field of Search ..................... 375/344, 336, 375/274; 455/182.2, 257, 192.2, 164.1; 331/34, 1 A

[56] References Cited

U.S. PATENT DOCUMENTS

| | | | |
|---|---|---|---|
| 5,495,506 | 2/1996 | Shoji | 375/344 |
| 5,557,643 | 9/1996 | Kim et al. | 375/344 |
| 5,633,898 | 5/1997 | Kishigami et al. | 375/344 |
| 5,634,205 | 5/1997 | Kurisu et al. | 455/182.2 |

FOREIGN PATENT DOCUMENTS 2-44886  2/1990  Japan.

*Primary Examiner*—T. Ghebretinsae
*Attorney, Agent, or Firm*—Ostrolenk, Faber, Gerb & Soffen, LLP

[57] ABSTRACT

An automatic frequency control circuit comprises an quadrature demodulation unit for creating an in-phase signal and an antiphase signal by quadrature-demodulating a Gaussian Minimum Shiftkeying signal and supplying an electric field strength signal exhibiting an electric field strength of the Gaussian Minimum Shiftkeying signal as well as the created in-phase and antiphase signals; a quality judging unit for judging the quality of the Gaussian Minimum Shiftkeying signal and creating an automatic frequency-controlling data indicating a compensation amount in accordance with the obtained quality signal; a converter for converting into digital signals the in-phase signal, antiphase signal and electric field strength signal supplied from the quadrature demodulation unit and converting the automatic frequency-controlling data into an analog signal; a temperature compensated crystal oscillation circuit for compensating the frequency of the GMSK signal on the basis of the compensation amount indicated by the automatic frequency-controlling data converted into an analog signal by the converter.

13 Claims, 3 Drawing Sheets

AUTOMATIC FREQUENCY CONTROL CIRCUIT APPLICABLE TO A MOBILE COMMUNICATION SYSTEM

BACKGROUNDS OF THE INVENTION

1. Field of the Invention

The present invention relates to an automatic frequency control circuit applicable to a mobile communication system, and more particularly to an automatic frequency control circuit for performing a frequency control such as to deal with Doppler shift, multipass fading or the like which occurs during the movement of the mobile communication system.

2. Description of the Related Art

This kind of a conventional automatic frequency control circuit is disclosed in Japanese Unexamined Patent Publication (Kokai) No. Heisei 2-44886. The important part of the automatic frequency control disclosed in this article is shown in FIG. 3.

In FIG. 3, a timing signal "T" for controlling counting movement is supplied from a timing signal generation circuit 102 to a counter 100 for counting an error detecting signal "C" from a PCM decoder 101. An inhibit circuit includes the counter 100, the timing signal generation circuit 102 and a judging circuit 110. The judging circuit 110 includes a latch circuit 111, a reference value generation circuit 112 and a comparison circuit 113.

A comparison unit 120 compares a count value from a counter 121 with a reference value from a reference value generation circuit 122, so as to supply a three-valued signal. The output signal "C" from the comparison unit 120 is supplied to a gate circuit 130. The gate circuit 130 prohibits the output signal "C1" of the comparison unit 120 from being supplied to a control circuit 131 if receiving from the comparison unit 113 such a high level signal as indicating that the count value of the counter 100 is more than the reference value.

More specifically, if the output value (count value) of the latch circuit 111 is more than the reference value as the result of the comparison of the comparison unit 113, the output of the comparison unit 113 is at a H level, the gate circuit 130 is closed to prohibit the comparison output "C1" of the comparison unit 120 from being supplied to the control circuit 131, thereby prohibiting the automatic frequency control operation.

The above-mentioned conventional automatic frequency control circuit is constituted in that the gate circuit 130 prohibits supplying the output signal of the comparison unit 120 to the control circuit 131 if receiving from the comparison unit 120 the high level signal indicating that the count value of the counter 100 is more that the reference value. Therefore, if Doppler shift, multipass fading or the like occurs during the movement of the system to affect the received signal, such a malfunction may occur in the conventional automatic frequency control circuit that the comparison unit 120 outputs a signal of high level and the gate circuit 130 prohibits the automatic frequency control operation.

SUMMARY OF THE INVENTION

The first object of the present invention is to provide an automatic frequency control circuit free from the malfunction caused by Doppler shift, multipass fading or the like, even if it may occur during the movement of a mobile communication system.

According to one aspect of the invention, an automatic frequency control circuit installed on a mobile communication system, comprising:

an quadrature demodulation means for creating an in-phase signal and an antiphase signal by quadrature-demodulating a Gaussian Minimum Shiftkeying signal being supplied to said means, and supplying an electric field strength signal exhibiting an electric field strength of the Gaussian Minimum Shiftkeying signal as well as said created in-phase and antiphase signals, a quality judging means for judging the quality of the Gaussian Minimum Shiftkeying signal on the basis of said in-phase signal, antiphase signal and electric field strength signal, and creating an automatic frequency-controlling data indicating a compensation amount in accordance with the obtained quality signal so as to supply the same, a conversion means for converting said in-phase signal, antiphase signal and electric field strength signal supplied from said quadrature demodulation means into digital signals so as to transfer them to said quality judging means, and converting said automatic frequency-controlling data supplied from said quality judging means into an analog signal, and, a compensating means for compensating the frequency of the Gaussian Minimum Shiftkeying signal on the basis of the compensation amount indicated by said automatic frequency-controlling data converted into an analog signal by said conversion means.

In the preferred construction, the quadrature demodulation means comprises a means for mixing the Gaussian Minimum Shiftkeying signal converted to a first intermediate frequency signal and an oscillation signal supplied from said compensating means on the basis of said automatic frequency-controlling data so as to convert them to a second intermediate frequency signal, and a means for quadrature-modulating the second intermediate frequency signal so as to create said in-phase signal and antiphase signal.

In the preferred construction, the quality judging means comprises a means for calculating an amount of interference between codes on the basis of said in-phase signal and antiphase signal, a means for calculating the quality of the signal by the combination of said codes interference amount and said electric field strength signal with the both as parameter, and a means for supplying said automatic frequency-controlling data indicating an compensation amount in accordance with the quality of the signal to said conversion means.

In another preferred construction, the quality judging means comprises a mutual-correlation factor calculating circuit for calculating the mutual-correlation factor of the input signal on the basis of said in-phase and antiphase signals to compute an amount of interference between codes, a signal quality calculating circuit for calculating the quality of the signal by the combination of said codes interference amount and said electric field strength signal with the both as parameter, a signal quality judging circuit for ranking the quality of the signal and supplying the control signal exhibiting a rank of the corresponding quality signal, and an automatic frequency-controlling data creating circuit for creating an automatic frequency-controlling data on the basis of said control signal.

In the above-mentioned construction, the mutual-correlation factor calculating circuit obtains eleven mutual-correlation factors by shifting across central continuous 16 bits among 26 bits of training sequence codes in one burst of the in-phase signal on the basis of the GSM, selects arbitrary five mutual-correlation factors from the obtained eleven mutual-correlation factors to totalize the absolute values thereof, and subtracts a total of the absolute values of the other six mutual-correlation factors from a total of the absolute values of all the eleven mutual-correlation factors, except for the five mutual-correlation factors having the absolute values of which total is maximum, thereby to transmit the obtained value as a codes interference amount signal.

In the above-mentioned construction, the signal quality calculating circuit having a table relating a combination of said codes interference amount and electric field strength signal to a numerical value predetermined to represent the quality of the input signal with the both as parameter, combines said codes interference amount calculated by said mutual-correlation factor calculating circuit and said electric field strength signal supplied via said conversion means and checks them with said table, thereby to transmit the corresponding numerical value as a quality signal representing the quality of the corresponding input signal.

In the above-mentioned construction, the signal quality judging circuit ranks the quality of the input signal calculated by said signal quality calculating circuit, and transmits a control signal for controlling said automatic frequency-controlling data creating circuit in order to perform the predetermined compensation to said automatic frequency-controlling data in accordance with the quality rank of the corresponding signal.

In the above-mentioned construction, the compensating means comprises a voltage controlled oscillation circuit for transmitting a predetermined signal which is used for the quadrature demodulation of the Gaussian Minimum Shiftkeying signal in said quadrature demodulation means, a temperature compensated crystal oscillation circuit for creating and supplying a compensation signal on the basis of said automatic frequency-controlling data, and a phase lock loop circuit for controlling the oscillation frequency of said voltage controlled oscillation circuit according to the compensation signal supplied from said temperature compensated crystal oscillation circuit; and the quadrature demodulation means comprises a means for mixing the Gaussian Minimum Shiftkeying signal converted to a first intermediate frequency signal and an oscillation signal supplied from said voltage controlled oscillation circuit of said compensating means so as to convert them to a second intermediate frequency signal, and a means for quadrature-modulating said second intermediate frequency signal so as to create said in-phase signal and antiphase signal.

Other objects, features and advantages of the present invention will become clear from the detailed description given herebelow.

BRIEF DESCRIPTION OF THE DRAWINGS

The present invention will be understood more fully from the detailed description given herebelow and from the accompanying drawings of the preferred embodiment of the invention, which, however, should not be taken to be limitative to the invention, but are for explanation and understanding only.

In the drawings.

DESCRIPTION OF THE PREFERRED EMBODIMENT

A preferred embodiment of the present invention will now be described in detail with reference to the accompanying drawings.

Figure 1:
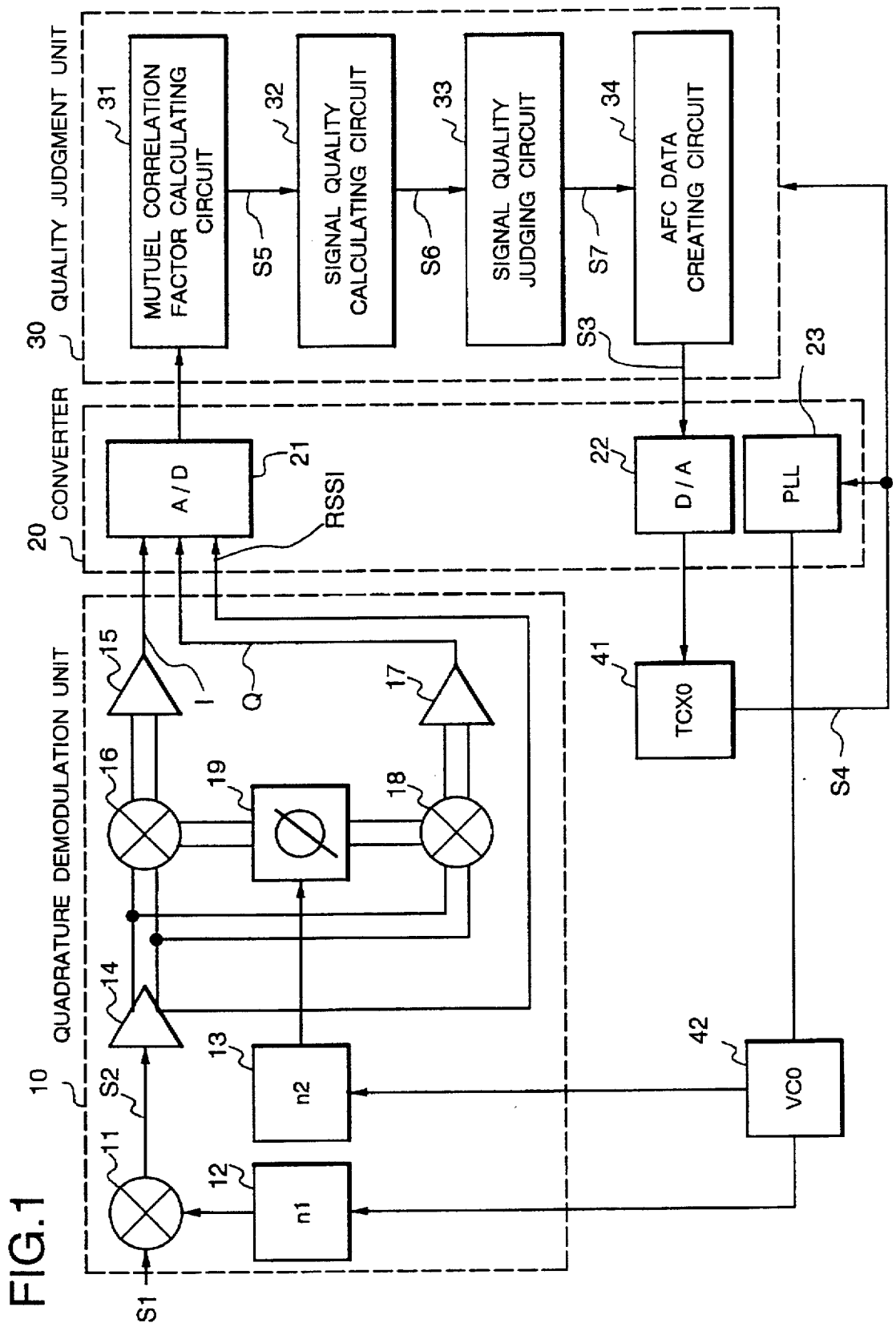
FIG. 1 is a block diagram showing a constitution of an automatic frequency control circuit according to the first embodiment of the present invention.

FIG. 1 is a block diagram showing the constitution of an automatic frequency control circuit according to the embodiment of the invention.

As shown in FIG. 1, the automatic frequency control circuit of the embodiment comprises an quadrature demodulation unit 10 for receiving a GMSK (Gaussian Minimum Shiftkeying) signal "S1" to quadrature-demodulate the same, a quality judgment unit 30 for judging the quality of the GMSK signal "S1", a converter 20 for carrying out digital to analog or analog to digital conversion of a signal between the quadrature demodulation unit 10 and the quality judgment unit 30, a temperature compensated crystal oscillation circuit (TCXO) 41 for compensating the frequency of the GMSK signal "S1" on the basis of a result of judgment by the quality judgment unit 30, and a voltage controlled oscillation circuit (VCO) 42. It is noted here that FIG. 1 shows only characteristic parts of the constitution in the embodiment, while the description of the other constitution is omitted.

The quadrature demodulation unit 10 includes a mixer 11 for receiving the GMSK signal "S1" converted to a first intermediate frequency signal and converting it to a second intermediate frequency signal, a frequency demultiplier 12, a frequency demultiplier 13 for quadrature-modulating the second intermediate frequency signal so as to create an in-phase signal "I" and an antiphase signal "Q", amplifiers 14, 15 and 17, mixers 16 and 18, and a phase shifter 19.

The GMSK signal "S1" received and converted to the first intermediate frequency signal by a mobile communication receiver is supplied to the mixer 11. The mixer 11 mixes a frequency divided signal by the frequency demultiplier 12 with the GMSK signal "S1" so as to create the second intermediate frequency signal "S2".

A signal is supplied from the voltage controlled oscillation circuit 42 to the frequency demultiplier 12. The frequency demultiplier divides the frequency of the signal by n1. The obtained frequency-divided signal is transferred to the mixer 11. It is noted here that n1 is an arbitrary whole number.

Further, a signal is supplied from the voltage controlled oscillation circuit 42 to the frequency demultiplier 13. The frequency demultiplier 13 divides the frequency of the signal by n2. The obtained frequency-divided signal is transferred to the phase shifter 19. It is noted here that n2 is an arbitrary whole number different from n1.

Provided at subsequent stages of the mixer 11 are the mixer 16 including the amplifier 14 at its input side and the amplifier 15 at its output side, the mixer 18 including the amplifier 14 at its input side and the amplifier 17 at its output side, and the phase shifter 19 for converting the phase of the second intermediate frequency signal "S2" supplied to the mixers 16 and 18.

The second intermediate frequency signal "S2" is supplied from the mixer 11 to the mixer 16 via the amplifier 14. The mixer 16 creates the in-phase signal "I" having the same phase as the second intermediate frequency signal "S2", and transmits it via the amplifier 15.

Also, the second intermediate frequency signal "S2" is supplied from the mixer 11 to the mixer 18 via the amplifier 14. The mixer 18 creates the antiphase signal "Q" of which phase is shifted at an angle of 90° with respect to the in-phase signal "I" supplied from the mixer 16. The mixer 18 supplies the antiphase signal "Q" via the amplifier 17.

The phase shifter 19 shifts the phase of the second intermediate frequency signal "S2" supplied to the mixer 18 at an angle of 90° with respect to the phase of the second intermediate frequency signal "S2" supplied to the mixer 16, thereby creating the in-phase signal "I" and the antiphase signal "Q".

The quadrature demodulation unit 10 transmits to the converter 20 the in-phase signal "I" and the antiphase signal "Q" thus created, as well as an electric field strength signal "RSSI" supplied from the amplifier 14.

The converter 20 includes an A/D conversion circuit 21, a D/A conversion circuit 22, and a PLL (Phase Lock Loop) circuit 23.

The A/D conversion circuit 21 converts the in-phase signal "I", the antiphase signal "Q" and the electric field strength signal "RSSI" transmitted from the quadrature demodulation unit 10 into digital signals so as to send them to the quality judgment unit 30.

The D/A conversion circuit 22 converts into an analog signal an automatic frequency-controlling data (referred to as AFC data hereinafter) signal "S3" transmitted from the quality judgment unit 30, which data will be described below. The D/A conversion circuit 22 sends the AFC data signal to the temperature compensated crystal oscillation circuit 41.

The PLL circuit 23 controls the voltage controlled oscillation circuit 42 on the basis of a compensation signal "S4" from the temperature compensated crystal oscillation circuit 41.

The quality judgment unit 30 includes a mutual-correlation factor calculating circuit 31 for calculating the mutual-correlation of the input signals, a signal quality calculating circuit 32 and a signal quality judging circuit 33 for judging the quality of the input signal on the basis of the calculated mutual-correlation of the input signal, and an AFC data creating circuit 34 for creating an AFC data in accordance with the quality of the input signal.

The in-phase signal "I" and the antiphase signal "Q" converted to the digital signals are supplied to the mutual-correlation factor calculating circuit 31. The circuits 31 calculates the mutual-correlation factor of the input signal to compute an amount of interference between codes. Concretely, the codes interference amount is computed in the following manner. At first, in the GSM(Global System for Mobile communication), central continuous 16 bits among 26 bits of training sequence codes in one burst of the in-phase signal "I" are shifted across, thereby to obtain eleven mutual-correlation factors. Arbitrary five mutual-correlation factors are selected from the obtained eleven mutual-correlation factors and the absolute values thereof are totalized. Except for the five mutual-correlation factors having the absolute values of which total is maximum, a total of the absolute values of the other six mutual-correlation factors is subtracted from a total of the absolute values of all the eleven mutual-correlation factors. The obtained value is supplied to the signal quality calculating circuit 32 as the codes interference amount signal "S5".

Essentially, the 16 bits corresponding to the six mutual-correlation factors having the absolute values whose total is maximum, are positioned at the center of the 26 bits of the training sequence codes unless the quality of the input signal is deteriorated. When the input signal is degraded in quality, the above 16 bits are shifted. Therefore, it can be detected by the above operation whether the quality of the input signal is deteriorated or not.

The signal quality calculating circuit 32 determines the quality of the input signal on the basis of the amount of interference between the codes exhibited by the codes interference amount signal "S5" supplied from the mutual-correlation factor calculating circuit 31 as well as the electric field strength signal "RSSI". To be concrete, the quality of the input signal is determined as follows. That is to say, the signal quality calculating circuit 32 has a table which relates a combination of the codes interference amount and the electric field strength signal "RSSI" to a numerical value predetermined to represent the quality of the input signal, with the codes interference amount and the electric field strength signal "RSSI" as parameter. The amount of interference between the codes of the input signal exhibited by the codes interference amount signal "S5" calculated by the mutual-correlation factor calculating circuit 31 and the electric field strength signal "RSSI" of the input signal supplied from the A/D conversion circuit 21 of the converter 20 are combined and checked with the table, and the corresponding numerical value is supplied to the signal quality judging circuit 33 as a quality signal "S6" representing the quality of the input signal.

The signal quality judging circuit 33 evaluates the quality of the input signal on the basis of the quality signal "S6" from the signal quality calculating circuit 32, and controls the AFC data creating circuit 34. More specifically, there are provided several ranks for evaluating the quality of the input signal, and it is judged which rank the quality signal "S6" of the input signal is in. A control signal "S7" for controlling the AFC data creating circuit 34 is supplied in order to perform a predetermined compensation to the AFC data in accordance with the quality rank of the quality signal "S6".

The AFC data creating circuit 34 compensates the AFC data on the basis of the control signal "S7" from the signal quality judging circuit 33, so as to create and supply the AFC data signal "S3". The output AFC data signal "S3" is not only utilized by the mobile communication system body, but also transferred to the D/A conversion circuit 22 of the converter 20. The AFC data is compensated by multiplying the AFC data by a compensation factor previously set in correspondence with every rank of the quality of the input signal.

A more detailed description will be made about the judgment of the quality of the input signal by the signal quality judging circuit 33 and the compensation of the AFC data performed by the AFC data creating circuit on the basis of that quality judgment.

More specifically, the signal quality judging circuit 33 fixes on the quality of the input signal either of eleven ranks between "10" exhibiting the highest quality and "0" exhibiting the lowest quality. The AFC data creating circuit 34 regards the ranks "3" and below as inferior quality and compensates the input signal in the same manner when any of the ranks "3" and below is fixed on the quality of the input signal. In this case, if the signal quality judging circuit 33 decides that the quality signal "S6" delivered from the signal quality calculating circuit 32 corresponds to the rank "10", the signal quality is kept by 100%. The AFC data creating circuit 34 multiplies the AFC data by a compensation factor predetermined in accordance with the quality. Then, the AFC data creating circuit 34 supplies the AFC data signal "S3" thus obtained.

In the case where the signal quality judging circuit 33 judges that the quality signal "S6" transmitted from the signal quality calculating circuit 32 corresponds to a rank "7", the signal quality is kept by 70%. The AFC data creating circuit 34 multiplies the AFC data by a compensation factor predetermined in accordance with the quality. Then, the AFC data creating circuit 34 supplies the AFC data signal "S3" thus obtained.

Further, if the signal quality judging circuit 33 judges that the quality signal "S6" transmitted from the signal quality calculating circuit 32 corresponds to the rank "3", the signal quality is kept by 30%. Because the AFC data creating circuit 34 treats the quality in the rank "3" and below as the same inferior quality, the AFC data creating circuit 34 multiplies the AFC data by a compensation factor predetermined in accordance with the quality in the rank "0". Then, the AFC data creating circuit 34 supplies the AFC data signal "S3" thus obtained.

Incidentally, how many ranks there provided for evaluating the quality of the input signal and how a compensation factor corresponding to each quality rank is predetermined, can be appropriately decided in accordance with the constitution or purpose of use of the mobile communication system, the frequency of an input signal to be dealt with by the communication system, or the like.

The AFC data signal "S3" converted to the analog signal by the D/A conversion circuit 22 of the converter 20 is supplied to the temperature compensated crystal oscillation circuit 41. The circuit 41 transmits the compensation signal "S4" on the basis of the AFC data signal "S3". The compensation signal "S3" is supplied to the PLL circuit 23 of the converter 20 to control the voltage controlled oscillation circuit 42. The signal "S3" is also supplied to the quality judgment unit 30 so as to be used as an operation clock for the respective circuits 31 to 34.

A control voltage of the voltage controlled oscillation circuit 42 is controlled by the PLL circuit 23, thereby to vary the oscillation frequency. Then, as described above, the output signal of the voltage controlled oscillation circuit 42 is supplied to the frequency demultipliers 12 and 13, so that information of the AFC data is fed back to the GMSK signal "S1".

Figure 2:
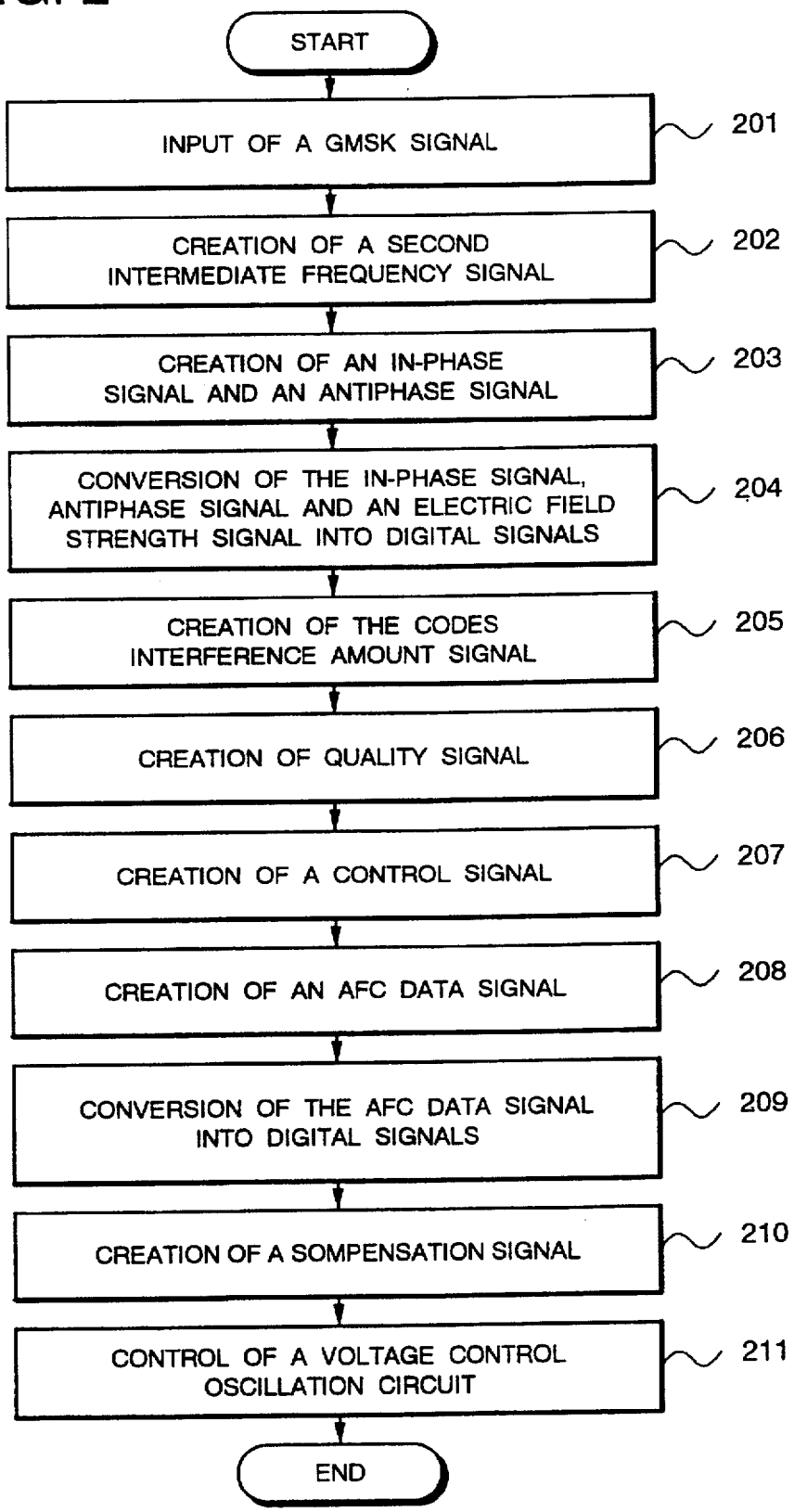
FIG. 2 is a flow chart showing an operation of the embodiment.
Figure 3:
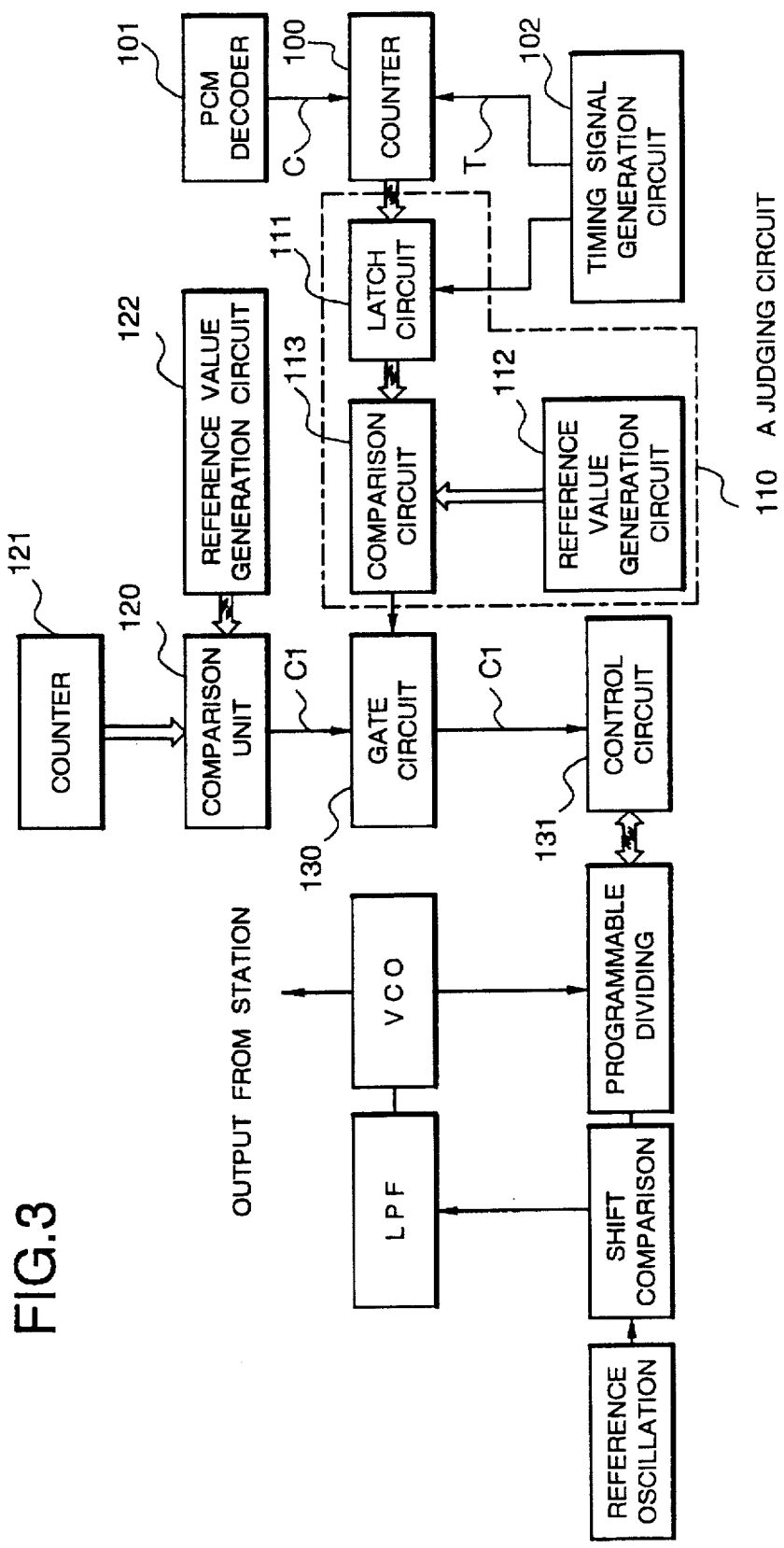
FIG. 3 is a block diagram showing a constitution of a conventional automatic frequency circuit.

Referring to a flow chart of FIG. 2, an operation of the embodiment will be described below.

When the received GMSK signal "S1" is supplied to the mixer 11 of the quadrature demodulation unit 10 (Step 201), the frequency demultiplying signal from the frequency demultiplier 12 is mixed with the GMSK signal "S1" so that the second intermediate frequency signal "S2" is created (Step 202). After being amplified by the amplifier 14, the second intermediate frequency signal "S2" is supplied to the mixers 16 and 18. After the phase of the second intermediate frequency signal "S2" is shifted by the phase shifter 19, it is amplified by the amplifiers 15 and 17 so as to be supplied to the converter 20 as the in-phase signal "I" and the "antiphase signal "Q" (Step 203). The second intermediate frequency signal "S2" is divided by the amplifier 14 and supplied to the converter 20 as the electric field strength signal "RSSI".

The in-phase signal "I", the antiphase signal "Q" and the electric field strength signal "RSSI" supplied to the converter 20 are converted to the digital signals by the A/D conversion circuit 21, so as to be supplied to the quality judgment unit 30 (Step 204).

When the in-phase signal "I" and the antiphase signal "Q" are supplied to the mutual-correlation factor calculating circuit 31 of the quality judgment unit 30, the amount of interference between the codes is calculated on the basis of the in-phase signal "I" and the antiphase signal "Q". The codes interference amount signal "S5" representing the result of the calculation is supplied to the signal quality calculating circuit 32 (Step 205). Subsequently, in the signal quality calculating circuit 32, the quality signal "S6" representing the quality of the input signal by a numerical value is created on the basis of the amount of interference between the codes exhibited by the codes interference amount signal "S5" and the electric field strength signal "RSSI", the quality signal "S6" being supplied to the signal quality judging circuit 33 (Step 206). Thereafter, the quality of the input signal is ranked on the basis of the quality signal "S6" supplied to the signal quality judging circuit 33. In this connection, the control signal "S7" is supplied so that the AFC data creating circuit 34 performs the compensation predetermined in correspondence to the rank of the signal (Step 207). When the control signal "S7" is supplied to the AFC data creating circuit 34, the AFC data is compensated in response to the control signal "S7", so as to supply the AFC data signal(Step 208).

The AFC data signal "S3" created by the AFC data creating circuit 34 is utilized by the mobile communication system body, and also supplied to the temperature compensated crystal oscillation circuit 41 after it has been converted to the analog signal by the D/A conversion circuit 22 (Step 209).

Consequently, the compensation signal "S4" corresponding to the AFC data signal "S3" is created in the temperature compensated crystal oscillation circuit 41 and supplied to the PLL circuit 23 (Step 210). The voltage controlled oscillation circuit 42 is controlled on the basis of the compensation signal "S4" by the PLL circuit 23, thereby carrying out the automatic frequency control (Step 211).

As described above, according to the automatic frequency control circuit of the present invention, since the frequency is automatically controlled on the basis of the result of judgment of the signal quality by the quality judgment unit 30, even when Doppler shift or multipass fading occurs during the movement of the mobile communication system, the frequency of the input signal can be compensated in accordance with the degradation of the quality of the signal. Thus, it is possible to prevent the malfunction of the mobile communication system such as stoppage of the operation of the system.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. An automatic frequency control circuit installed on a mobile communication system, comprising:

an quadrature demodulation means for creating an in-phase signal and an antiphase signal by quadrature-demodulating a Gaussian Minimum Shiftkeying signal being supplied, and supplying an electric field strength signal exhibiting an electric field strength of the Gaussian Minimum Shiftkeying signal as well as said created in-phase and antiphase signals, a quality judging means for judging the quality of the Gaussian Minimum Shiftkeying signal on the basis of said in-phase signal, antiphase signal and electric field strength signal, and creating an automatic frequency-controlling data indicating a compensation amount in accordance with the obtained quality signal so as to supply the same, a conversion means for converting said in-phase signal, antiphase signal and electric field strength signal supplied from said quadrature demodulation means into digital signals so as to transfer them to said quality judging means, and converting said automatic frequency-controlling data supplied from said quality judging means into an analog signal, and, a compensating means for compensating the frequency of the Gaussian Minimum Shiftkeying signal on the basis of the compensation amount indicated by said automatic frequency-controlling data converted into an analog signal by said conversion means.

2. An automatic frequency control circuit as set forth in claim 1, wherein said quadrature demodulation means comprises a means for mixing the Gaussian Minimum Shiftkeying signal converted to a first intermediate frequency signal and an oscillation signal supplied from said compensating means on the basis of said automatic frequency-controlling data so as to convert them to a second intermediate frequency signal, and a means for quadrature-modulating the second intermediate frequency signal so as to create said in-phase signal and antiphase signal.

3. An automatic frequency control circuit as set forth in claim 1, wherein said quality judging means comprises a means for calculating an amount of interference between codes on the basis of said in-phase signal and antiphase signal, a means for calculating the quality of the signal by the combination of said codes interference amount and said electric field strength signal with the both as parameter, and a means for supplying said automatic frequency-controlling data indicating said compensation amount in accordance with the quality of the signal to said conversion means.

4. An automatic frequency control circuit as set forth in claim 1, wherein:

said quadrature demodulation means comprises a means for mixing the Gaussian Minimum Shiftkeying signal converted to a first intermediate frequency signal and an oscillation signal supplied from said compensating means on the basis of said automatic frequency-controlling data so as to convert them to a second intermediate frequency signal, and a means for quadrature-modulating the second intermediate frequency signal so as to create said in-phase signal and antiphase signal; and said quality judging means comprises a means for calculating an amount of interference between codes on the basis of said in-phase signal and antiphase signal, a means for calculating the quality of the signal by the combination of said codes interference amount and said electric field strength signal with the both as parameter, and a means for supplying said automatic frequency-controlling data indicating said compensation amount in accordance with the quality of the signal to said conversion means.

5. An automatic frequency control circuit as set forth in claim 1, wherein said quality judging means comprises a mutual-correlation factor calculating circuit for calculating the mutual-correlation factor of an input signal on the basis of said in-phase and antiphase signals to compute an amount of interference between codes, a signal quality calculating circuit for calculating the quality of the signal by the combination of said codes interference amount and said electric field strength signal with the both as parameter, a signal quality judging circuit for ranking the quality of the signal and supplying a control signal exhibiting a rank of the corresponding quality signal, and an automatic frequency-controlling data creating circuit for creating said automatic frequency-controlling data on the basis of said control signal.

6. An automatic frequency control circuit as set forth in claim 5, wherein said mutual-correlation factor calculating circuit obtains eleven mutual-correlation factors by shifting across central continuous 16 bits among 26 bits of training sequence codes in one burst of the in-phase signal on the basis of the GSM, selects arbitrary five mutual-correlation factors from the obtained eleven mutual-correlation factors to totalize the absolute values thereof, and subtracts a total of the absolute values of the other six mutual-correlation factors from a total of the absolute values of all the eleven mutual-correlation factors, except for the five mutual-correlation factors having the absolute values of which total is maximum, thereby to transmit the obtained value as a codes interference amount signal.

7. An automatic frequency control circuit as set forth in claim 5, wherein said signal quality calculating circuit having a table relating a combination of said codes interference amount and electric field strength signal to a numerical value predetermined to represent the quality of the input signal with the both as parameter, combines said codes interference amount calculated by said mutual-correlation factor calculating circuit and said electric field strength signal supplied via said conversion means and checks them with said table, thereby to transmit the corresponding numerical value as a quality signal representing the quality of the corresponding input signal.

8. An automatic frequency control circuit as set forth in claim 5, wherein said signal quality judging circuit ranks the quality of the input signal calculated by said signal quality calculating circuit, and transmits the control signal for controlling said automatic frequency-controlling data creating circuit in order to perform the predetermined compensation to said automatic frequency-controlling data in accordance with the quality rank of the corresponding signal.

9. An automatic frequency control circuit as set forth in claim 5, wherein:

said mutual-correlation factor calculating circuit obtains eleven mutual-correlation factors by shifting across central continuous 16 bits among 26 bits of training sequence codes in one burst of the in-phase signal on the basis of the GSM, selects arbitrary five mutual-correlation factors from the obtained eleven mutual-correlation factors to totalize the absolute values thereof, and subtracts a total of the absolute values of the other six mutual-correlation factors from a total of the absolute values of all the eleven mutual-correlation factors, except for the five mutual-correlation factors having the absolute values of which total is maximum, thereby to transmit the obtained value as a codes interference amount signal; and said signal quality calculating circuit having a table relating a combination of said codes interference amount and electric field strength signal to a numerical value predetermined to represent the quality of the input signal with the both as parameter, combines the amount of interference between the codes exhibited by said codes interference amount signal supplied from said mutual-correlation factor calculating circuit and said electric field strength signal supplied via said conversion means and checks them with said table, thereby to transmit the corresponding numerical value as a quality signal representing the quality of the corresponding input signal.

10. An automatic frequency control circuit as set forth in claim 5, wherein:

said signal quality calculating circuit having a table relating a combination of said codes interference amount and electric field strength signal to a numerical value predetermined to represent the quality of the input signal with the both as parameter, combines said codes interference amount calculated by said mutual-correlation factor calculating circuit and said electric field strength signal supplied via said conversion means and checks them with said table, thereby to transmit the corresponding numerical value as a quality signal representing the quality of the corresponding input signal; and said signal quality judging circuit ranks the quality of the input signal exhibited by the quality signal supplied from said signal quality calculating circuit, and supplies the control signal for controlling said automatic frequency-controlling data creating circuit in order to perform the predetermined compensation to said automatic frequency-controlling data in accordance with the quality rank of the corresponding signal.

11. An automatic frequency control circuit as set forth in claim 5, wherein:

said mutual-correlation factor calculating circuit obtains eleven mutual-correlation factors by shifting across central continuous 16 bits among 26 bits of training sequence codes in one burst of the in-phase signal on the basis of the GSM, selects arbitrary five mutual-correlation factors from the obtained eleven mutual-correlation factors to totalize the absolute values thereof, and subtracts a total of the absolute values of the other six mutual-correlation factors from a total of the absolute values of all the eleven mutual-correlation factors, except for the five mutual-correlation factors having the absolute values of which total is maximum, thereby to transmit the obtained value as a codes interference amount signal;

said signal quality calculating circuit having a table relating a combination of said codes interference amount and electric field strength signal to a numerical value predetermined to represent the quality of the input signal with the both as parameter, combines the amount of interference between the codes exhibited by said codes interference amount signal supplied from said mutual-correlation factor calculating circuit and said electric field strength signal supplied via said conversion means and checks them with said table, thereby to transmit the corresponding numerical value as a quality signal representing the quality of the corresponding input signal; and said signal quality judging circuit ranks the quality of the input signal exhibited by the quality signal supplied from said signal quality calculating circuit, and supplies the control signal for controlling said automatic frequency-controlling data creating circuit in order to perform the predetermined compensation to said automatic frequency-controlling data in accordance with the quality rank of the corresponding signal.

12. An automatic frequency control circuit as set forth in claim 1, wherein:

said compensating means comprises a voltage controlled oscillation circuit for transmitting a predetermined signal which is used for the quadrature demodulation of the Gaussian Minimum Shiftkeying signal in said quadrature demodulation means, a temperature compensated crystal oscillation circuit for creating and supplying a compensation signal on the basis of said automatic frequency-controlling data, and a phase lock loop circuit for controlling the oscillation frequency of said voltage controlled oscillation circuit according to the compensation signal supplied from said temperature compensated crystal oscillation circuit; and said quadrature demodulation means comprises a means for mixing the Gaussian Minimum Shiftkeying signal converted to a first intermediate frequency signal and an oscillation signal supplied from said voltage controlled oscillation circuit of said compensating means so as to convert them to a second intermediate frequency signal, and a means for quadrature-modulating said second intermediate frequency signal so as to create said in-phase signal and antiphase signal.

13. An automatic frequency control circuit as set forth in claim 1, wherein:

said quality judging means comprises a mutual-correlation factor calculating circuit for calculating the mutual-correlation factor of an input signal on the basis of said in-phase and antiphase signals to compute an amount of interference between codes, a signal quality calculating circuit for calculating the quality of the signal by the combination of said codes interference amount and said electric field strength signal with the both as parameter, a signal quality judging circuit for ranking the quality of the signal and supplying a control signal exhibiting a rank of the corresponding quality signal, and an Automatic frequency-controlling data creating circuit for creating said automatic frequency-controlling data on the basis of said control signal;

said compensating means comprises a voltage controlled oscillation circuit for transmitting a predetermined signal which is used for the quadrature demodulation of the Gaussian Minimum Shiftkeying signal in said quadrature demodulation means, a temperature compensated crystal oscillation circuit for creating and supplying a compensation signal on the basis of said automatic frequency-controlling data, and a phase lock loop circuit for controlling the oscillation frequency of said voltage controlled oscillation circuit according to the compensation signal supplied from said temperature compensated crystal oscillation circuit; and said quadrature demodulation means comprises a mixer for mixing the Gaussian Minimum Shiftkeying signal converted to a first intermediate frequency signal and an oscillation signal supplied from said voltage controlled oscillation circuit of said compensating means so as to convert them to a second intermediate frequency signal, and mixers or a phase shifter for quadrature-modulating said second intermediate frequency signal so as to create said in-phase signal and antiphase signal.

* * * * *